United States Patent [19]
Takuchi et al.

[11] Patent Number: 5,592,042
[45] Date of Patent: Jan. 7, 1997

[54] PIEZOELECTRIC/ELECTROSTRICTIVE ACTUATOR

[75] Inventors: Yukihisa Takuchi; Masato Komazawa, both of Nagoya, Japan

[73] Assignee: NGK Insulators, Ltd., Japan

[21] Appl. No.: 123,196

[22] Filed: Sep. 20, 1993

Related U.S. Application Data

[63] Continuation of Ser. No. 860,127, Mar. 31, 1992, abandoned, which is a continuation of Ser. No. 551,176, Jul. 11, 1990, abandoned.

[30]  Foreign Application Priority Data

Jul. 11, 1989 [JP] Japan .................................. 1-178747
Jan. 20, 1990 [JP] Japan .................................. 2-11173

[51] Int. Cl.$^6$ .................................................. H01L 41/08
[52] U.S. Cl. ..................... 310/328; 310/328; 310/346; 310/358; 310/330
[58] Field of Search ............................. 310/323, 358, 310/328, 346, 330–332

[56]  References Cited

U.S. PATENT DOCUMENTS

| | | |
|---|---|---|
| 2,540,194 | 2/1951 | Ellett . |
| 3,114,849 | 12/1963 | Poschenrieder ............... 310/359 X |
| 3,509,387 | 4/1970 | Thorn et al. ..................... 310/323 |
| 4,409,510 | 10/1983 | Assenza et al. ................ 310/334 |
| 4,491,761 | 1/1985 | Grudkowski et al. .......... 310/328 X |
| 4,638,206 | 1/1987 | Tsunooka et al. ............... 310/359 X |
| 4,675,960 | 6/1987 | Higgins, Jr. ..................... 310/338 X |
| 4,680,595 | 7/1987 | Cruz-Uribe et al. . |
| 4,766,671 | 8/1988 | Utsumi et al. ................... 29/848 |
| 4,812,698 | 3/1989 | Chida et al. ..................... 310/332 X |

FOREIGN PATENT DOCUMENTS

| | | |
|---|---|---|
| 0262637 | 4/1988 | European Pat. Off. . |
| 2570223 | 3/1986 | France . |
| 45-6103 | 3/1970 | Japan . |
| 46-26140 | 9/1971 | Japan . |
| 0253873 | 11/1986 | Japan .................................. 310/363 |
| 0023380 | 1/1987 | Japan .................................. 310/323 |
| 62-213399 | 9/1987 | Japan . |
| 0298190 | 12/1987 | Japan .................................. 310/330 |
| 0298189 | 12/1987 | Japan .................................. 310/332 |
| 0031480 | 2/1988 | Japan .................................. 310/323 |
| 0072171 | 4/1988 | Japan .................................. 310/358 |
| 0072172 | 4/1988 | Japan .................................. 310/358 |
| 2161647 | 1/1986 | United Kingdom . |
| 89/07259 | 8/1989 | WIPO . |

OTHER PUBLICATIONS

*Piezoelectric Ceramics* by Jaffe– et al, Academic Press, N.Y. 1971 pp. 86, 87.

Japanese Journal of Applied Physics, vol. 28 (1989(Supplement 28–2, pp. 77–79; Kawamura, Yukinori et al., "Microstructure and Piezoelectric Properties of PZT Based Ceramics".

"Ceramic Grain Size and Electric–Field Induced Strain", pp. 40–43, Fundamentals and Applications of Piezoelectric/ Electrostrictive Actuators, Kenji Uchino, 1st Edition, 2nd Print, Dec. 20, 1986, Morikita Publishing Co., Tokyo.

*Primary Examiner*—Mark O. Budd
*Attorney, Agent, or Firm*—Parkhurst, Wendel & Burr, L.L.P.

[57]  ABSTRACT

A piezoelectric/electrostrictive actuator comprising a substrate, a plurality of electrodes in the form of strips formed on at least one surface of the substrate such that the electrode strips are spaced from each other in a direction parallel to the substrate surface, and a piezoelectric/electrostrictive portion which is disposed between the adjacent strips of the electrodes in the spacing direction, and in contact with the adjacent electrode strips, so that the piezoelectric/electrostrictive portion produces a flexural displacement or force due to at least the longitudinal mode of converse piezoelectric or electrostrictive effect upon application of a voltage between the adjacent electrode strips.

6 Claims, 6 Drawing Sheets

PIEZOELECTRIC/ELECTROSTRICTIVE ACTUATOR

This is a continuation of Ser. No. 07/860,127 filed Mar. 31, 1992, now abandoned, which in turn is a continuation of Ser. No. 07/551,176, filed Jul. 11, 1990, now abandoned.

BACKGROUND OF THE INVENTION

1. Field of the Invention

The present invention relates to improvements in the construction of a piezoelectric or electrostrictive actuator of bi-morph or uni-morph type used as or for a displacement-controllable element, an ink jet ejector, a VTR head, a switching element, a relay, a print head, a pump, a fan or blower, and other components or devices. The term "actuator" used herein is a member capable of transducing or converting an electric energy or signal into a mechanical force, displacement or strain.

2. Discussion of the Prior Art

Recently, an element whose displacement can be controlled has been widely used and increasingly needed in the fields of optics and precision positioning or machining operations, for example, for adjusting or changing an optical path length or the position of a member or component of a device, on the order of fractions of a micron ($\mu$m). To meet this need, there have been proposed and developed various piezoelectric or electrostrictive actuators utilizing a piezoelectric or electrostrictive material such as a ferroelectric material, which exhibits the reverse or converse piezoelectric effect or the electrostrictive effect, in which the application of a voltage or electric field to such a piezoelectric or electrostrictive material produces a mechanical displacement.

Conventionally, the piezoelectric/electrostrictive actuator is structurally classified into a mono-morph type, a uni-morph type, a bi-morph type and a lamination type. The mono-morph, uni-morph and bi-morph types provide a relatively large amount of bending or flexural displacement or deflection or distortion owing to the transverse mode of converse piezoelectric or electrostrictive effect, namely, due to the strain perpendicular to the direction of the electric field produced upon application of a voltage. However these types suffer from inherent problems such as a small magnitude of a force generated, a low response speed, a low level of electro-mechanical conversion efficiency, and a low degree of operating reliability due to the use of an adhesive for bonding the component layers. On the other hand, the lamination type utilizes the longitudinal mode of converse piezoelectric or electrostrictive effect, namely, the strain parallel to the direction of the electric field produced by the applied voltage, and therefore assures a large magnitude of the generated force, a high response speed, and a high level of electro-mechanical conversion efficiency. However, the lamination type suffers from an inherent problem that the amount of displacement produced is relatively small.

Thus, the conventional piezoelectric or electrostrictive actuators have drawbacks as well as advantages.

U.S. Pat. No. 2,540,194 discloses a piezoelectric transducer or actuator of the mono-morph type, which uses a generally elongate piezoelectric slab, and electrodes in the form of strips formed on a surface or surfaces of the slab. The electrode strips extend in the direction of width of the slab and are spaced from each other at predetermined intervals in the direction of length of the slab. In the piezoelectric actuator disclosed in this patent, the application of a voltage to the electrodes causes a mechanical strain only in a portion of the piezoelectric slab which is adjacent to the surface or surfaces on which the electrodes are formed. Accordingly, the amount of flexural displacement or deflection or distortion of the slab, and the magnitude of a force produced by the piezoelectric slab are extremely small or insufficient. In this respect, it is noted that no piezoelectric material exists between the adjacent electrode strips, as viewed in the longitudinal direction of the slab.

SUMMARY OF THE INVENTION

It is accordingly a first object of the present invention to provide a piezoelectric/electrostrictive actuator which does not use a bonding adhesive or cement and which undergoes a sufficient amount of flexural displacement or deflection or distortion by application of a relatively low voltage, with an improved response to the applied voltage, such that the bending displacement and the force are generated owing to at least the longitudinal mode of converse piezoelectric or electrostrictive effect produced by the applied voltage.

A second object of the invention is to provide a piezoelectric/electrostrictive actuator which utilizes both the longitudinal mode effect and the transverse mode effect, which causes a strain parallel to the direction of the electric field produced by an applied voltage, and a strain perpendicular to the direction of the electric field, so that the flexural displacement or distortion and the force are effectively produced. The term "longitudinal mode effect" means the converse piezoelectric or electrostrictive effect parallel to the direction of the electric field. The term "transverse mode effect" means the converse piezoelectric or electrostrictive effect perpendicular to the direction of the electric field.

The above objects may be achieved according to the principle of the present invention, which provides a piezoelectric/electrostrictive actuator comprising a substrate, a plurality of electrodes in the form of strips formed on at least a portion of at least one surface of the substrate such that the strips are spaced from each other in a direction parallel to the above-indicated at least one surface of the substrate, and a piezoelectric/electrostrictive portion which is disposed between the adjacent strips of the electrodes in the above-indicated direction, and in contact with the adjacent strips, so that the piezoelectric/electrostrictive portion undergoes a flexural displacement or force due to at least a longitudinal mode of converse piezoelectric or electrostrictive effect obtained upon application of a voltage between the adjacent strips of the electrodes.

In the piezoelectric/electrostrictive actuator of the present invention constructed as described above, a voltage supplied from an external source is applied between the adjacent electrode strips, so that the local areas of the piezoelectric/electrostrictive portion each positioned between the adjacent electrode strips are subjected to electric fields produced in the direction parallel to the plane of the substrate, whereby strains occur in the piezoelectric/electrostrictive portion effectively in the plane parallel to the substrate surface on which the electrode strips are formed. Namely, the strains are produced due to the longitudinal mode of converse piezoelectric or electrostrictive effect generated by the electric fields by application of the voltage, whereby the substrate is bent or distorted in the direction perpendicular to the plane of the substrate, and produces a force in that direction. The direction of the strains generated in the piezoelectric/electrostrictive portion in the plane parallel to the plane of the substrate can be selected as desired, by suitably determining the direction in which the electrode strips are spaced from each other. The present arrangement permits a large amount of displacement of the substrate with a relatively low voltage applied to the electrode strips, and assures an improved response to the voltage application.

In one preferred form of the invention, the strips of the electrodes are provided by parallel elongate parts of two comb-like electrode patterns which are patterned and positioned relative to each other such that the elongate parts of one of the two electrode patterns and the elongate parts of the other electrode pattern are disposed alternately in the direction perpendicular to the length of the elongate parts. Each one of the two comb-like electrode patterns includes a connecting portion which connects the elongate parts at one of opposite ends thereof such that the elongate parts of that one electrode pattern extend from the connecting portion thereof toward the connecting portion of the other electrode pattern.

In another preferred form of the invention, the electrode strips and the piezoelectric/electrostrictive portion are formed on one of opposite major surfaces of the substrate, and the actuator further comprises a laminar structure formed on the other of the opposite major surfaces of the substrate. The laminar structure consists of a first electrode layer, a piezoelectric/electrostrictive layer, and a second electrode layer, which layers are formed in this order so that the piezoelectric/electrostrictive layer is sandwiched by and between the electrode layers.

The above form of the invention provides a piezoelectric/electrostrictive actuator of a bi-morph type, wherein the longitudinal mode effect is provided by the combination of the electrode strips and the piezoelectric/electrostrictive portion, while at the same time the transverse mode effect is provided by the laminar structure consisting of the two electrode layers and the piezoelectric/electrostrictive layer sandwiched by the electrode layers. That is, both the longitudinal mode and the transverse mode are generated by establishing the electric fields only in the direction in which the piezoelectric/electrostrictive portion and layer are polarized. Thus, the bi-morph type actuator provides a comparatively large amount of flexural or bending displacement of the substrate, and is protected against deterioration or loss of the initial polarization of the piezoelectric/electrostrictive material, whereby the operating durability and reliability are increased.

Further, the present actuator can be driven by applying a voltage in the direction parallel to the plane of the substrate, namely, without a voltage applied in the direction of thickness of the substrate. Accordingly, the present actuator may use a relatively thin layer of piezoelectric or electrostrictive material to form the piezoelectric/electrostrictive portion and/or layer, since a potential defect or flaw of the piezoelectric or electrostrictive film is less likely to lower the dielectric breakdown voltage or cause shear stresses between the electrode strips and the piezoelectric or electrostrictive material.

Moreover, the present actuator is constructed to lower the required level of the drive voltage by reducing the distance between the adjacent electrode strips, i.e., the width of the piezoelectric or electrostrictive material between the adjacent electrode strips, rather than reducing the thickness of the piezoelectric or electrostrictive material of the piezoelectric/electrostrictive portion. While reducing the thickness of the piezoelectric/electrostrictive portion for lowering the required drive voltage tends to cause an insulation failure and reduction of the produced force of the actuator, the reduction of the width of the piezoelectric/electrostrictive material is less likely to cause such insulation failure and force reduction. Furthermore, the cellular structure of the piezoelectric/electrostrictive portion whose local areas are disposed between the adjacent electrode strips is less likely to be influenced by a difference in the heat expansion coefficient between the substrate material and the piezoelectric or electrostrictive material, whereby the amount of displacement or force produced by the actuator can be accurately controlled by the drive voltage.

The substrate may be constituted by a piezoelectric/electrostrictive plate or layer formed of a piezoelectric/electrostrictive material, and two electrode layers formed so as to sandwich the piezoelectric/electrostrictive plate or layer. Further, the electrode strips may be embedded in the piezoelectric/electrostrictive portion.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Referring first to FIGS. 1–4 and 10, 11, there are shown different forms of the piezoelectric or electrostrictive actuator of the uni-morph type embodying the present invention.

Figure 1:
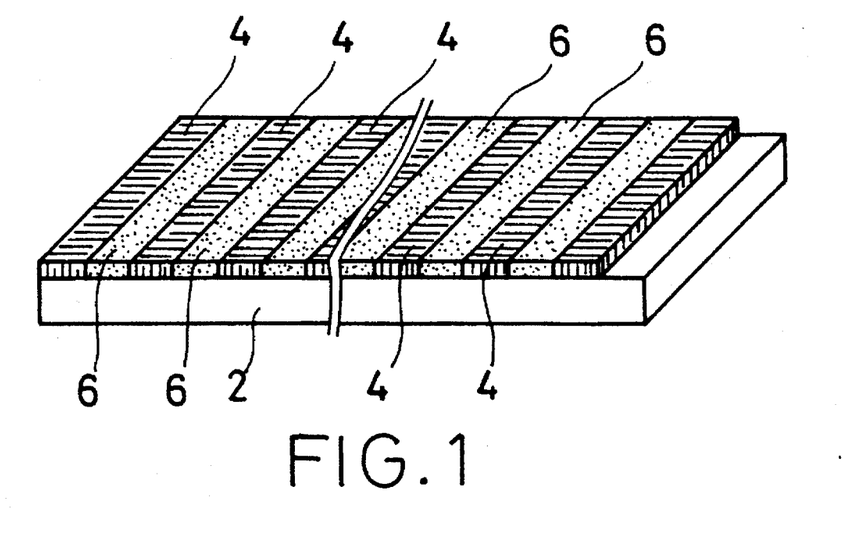
FIG. 1 through FIG. 11 are perspective views illustrating different forms of the piezoelectric/electrostrictive actuator of the present invention, FIGS. 1 and 3 being partly cut-away views while FIGS. 4–10 being fragmentary views.

The piezoelectric/electrostrictive actuator shown in FIG. 1 uses a generally elongate rectangular substrate 2. On one of the opposite major surfaces of this substrate 2, there are formed a plurality of electrodes in the form of parallel elongate rectangular strips 4 such that the strips 4 extend in the direction of width of the substrate 2 and are spaced apart from each other at a predetermined interval, in the direction of length of the substrate 2. Rectangular elongate spaces defined between each pair of the adjacent electrode strips 4 are filled by a selected piezoelectric or electrostrictive material in the form of elongate rectangular elements 6, such that these piezoelectric/electrostrictive elements 6 are separated and spaced apart from each other by the adjacent electrode strips 4. The electrode strips 4 and the piezoelectric/electrostrictive elements 6 are formed integrally with the substrate 2. Usually, all the electrode strips 4 have the same width, and are equally spaced from each other at a desired spacing pitch. It is desirable that the spacing distance between the adjacent electrode strips 4, namely, the width of each piezoelectric/electrostrictive element 6 be larger than the width of the electrode strips 4. To obtain a relatively large amount of displacement of the actuator by application of a relatively low voltage to the electrode strips 4, the spacing pitch of the strips 4 is preferably 200 $\mu$m or less, more preferably 100 $\mu$m or less, and most preferably 60 $\mu$m or less. The thickness of the electrode strips 4 is preferably 3 $\mu$m or more, more preferably 10 $\mu$m or more, and most preferably 20 $\mu$m or more.

In operation of the thus constructed piezoelectric/electrostrictive actuator, the piezoelectric/electrostrictive elements 6 are subjected to an electric field upon application of a voltage to the electrode strips 4 in the same manner as known in the art. As a result, the elements 6 undergo displacement in the direction perpendicular to the plane of the substrate 2, based on the longitudinal mode of converse piezoelectric/electrostrictive effect, i.e., due to the strain which occurs in the direction parallel to the direction of the electric field produced upon application of a voltage between the electrode strips 4. As a result, the actuator bends and produces a force, in the direction perpendicular to the plane of the substrate 2, in proportion to the applied voltage.

Figure 2:
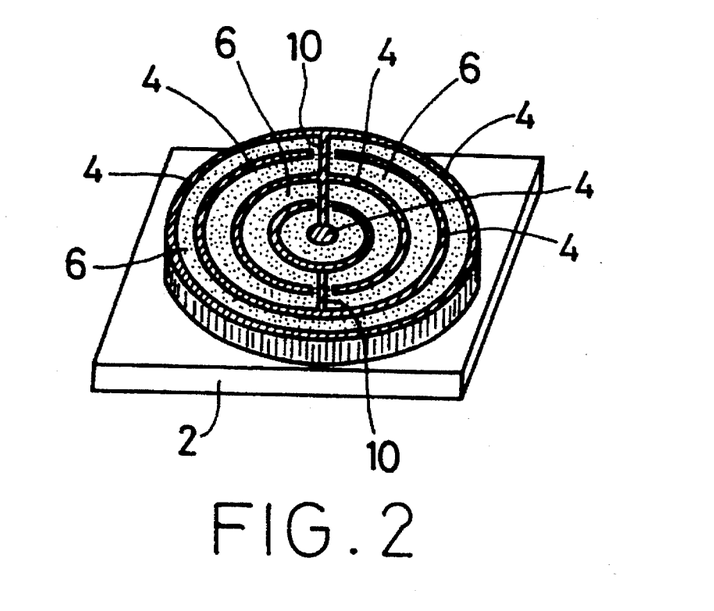
Figure 11:
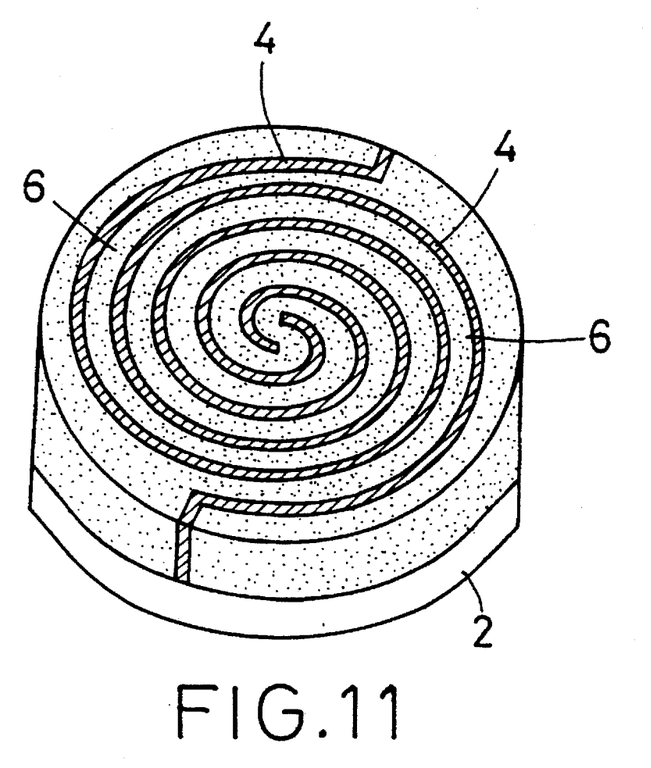

In the piezoelectric/electrostrictive actuators shown in FIGS. 2 and 11, the substrates 2 have a square and a circular shape, respectively. On one of the opposite major surfaces of the square substrate 2 of FIG. 2, the electrodes 4 are formed as concentric circular strips 4, while the piezoelectric/electrostrictive elements 6 are formed so as to fill annular spaces defined between the adjacent circular strips 4. A voltage is applied between the adjacent electrode strips 4 through connecting portions 10. In the actuator shown in FIG. 11, the electrodes 4 take the form of two spiral strips formed on one of the opposite major surfaces of the circular substrate 2, and the piezoelectric/electrostrictive elements 6 are formed so as to fill spiral spaces defined between the two spiral electrode strips 4.

Figure 3:
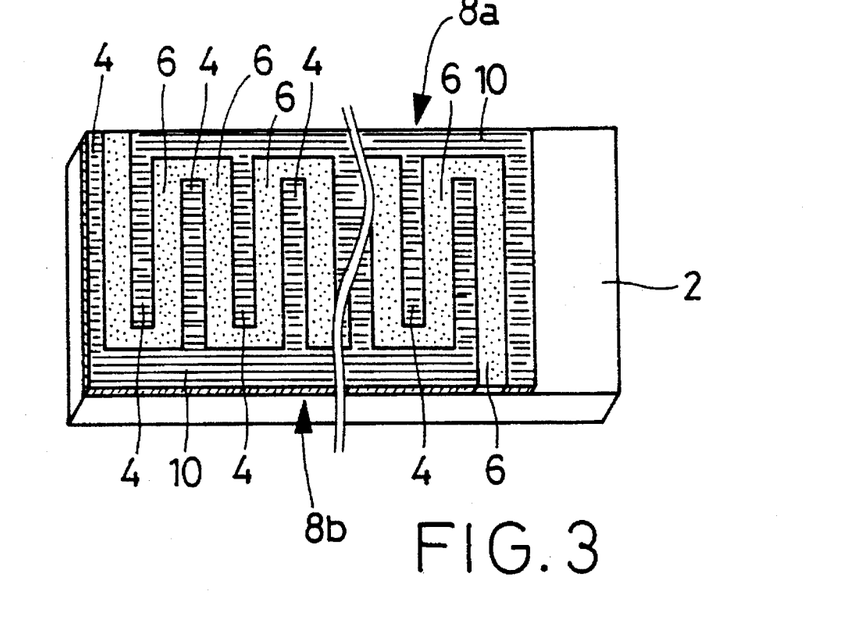
Figure 4:
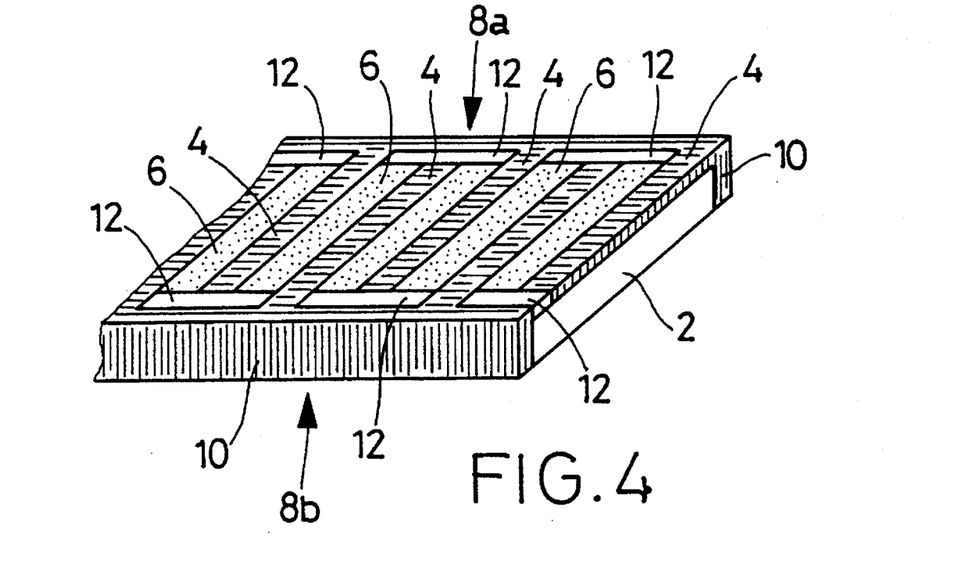

Referring to FIGS. 3 and 4, there are shown modifications of the embodiment of FIG. 1, in which a pair of comb-like electrode patterns 8a, 8b are formed such that the electrode strips 4 of one of the two patterns 8a, 8b are disposed between those of the other pattern 8b, 8a. That is, the even-numbered electrode strips 4 (as counted from the left side of FIG. 3) are connected to each other at their corresponding ends by a connecting portion 10, to provide the comb-like electrode pattern 8a, while the odd-numbered electrode strips 4 are connected to each other at their corresponding ends by another connecting portion 10, to provide the other comb-like electrode pattern 8b. The two connecting portions 10, 10 are formed along the opposite longitudinal edges of the substrate 2, so that the electrode strips 4 are connected alternately to the one and the other connecting portions 10, at the widthwise ends of the substrate 2. Namely, the strips 4 of the electrode pattern 8a and the strips 4 of the other electrode pattern 8b are disposed alternately in the direction of extension of the connecting portions 10, 10. In the embodiment of FIG. 4, the connecting portions of the comb-like electrode patterns 8a, 8b are formed so as to also cover the widthwise end faces of the substrate 2. The connecting portions 10 facilitate a voltage supply to the electrode strips 4.

In the embodiment of FIG. 4, insulating portions 12 are formed so as to provide electrical insulation between the connecting portion 10 of one of the two electrode patterns 8a, 8b and the non-connected end of the appropriate one of the electrode strips 4 of the other electrode patterns 8b, 8a, so that the insulating portions 12 prevent electrostrictive strain in the corresponding areas of the actuator.

Figure 5:
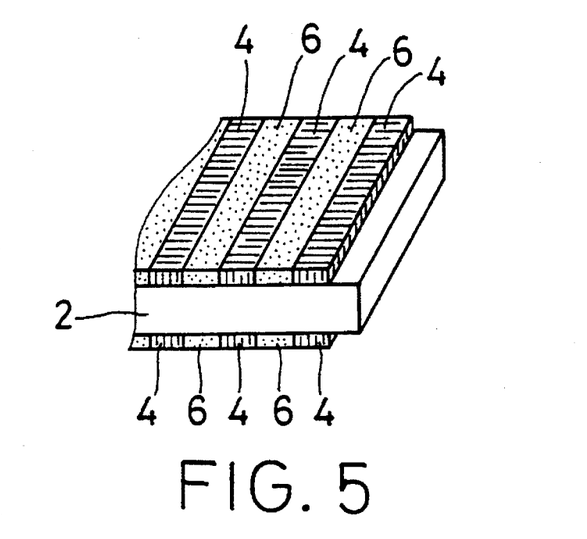

Reference is now made to FIGS. 5 through 9, which show piezoelectric or electrostrictive actuators of the bi-morph type. In the bi-morph type actuator of FIG. 5, a layer consisting of the alternately formed electrode strips 4 and piezoelectric/electrostrictive elements 6 is formed on both of the opposite major surfaces of the substrate 2. That is, the arrangement of the electrode strips 4 and piezoelectric/electrostrictive elements 6 as shown in FIG. 5 is applied to the bi-morph type.

Figure 6:
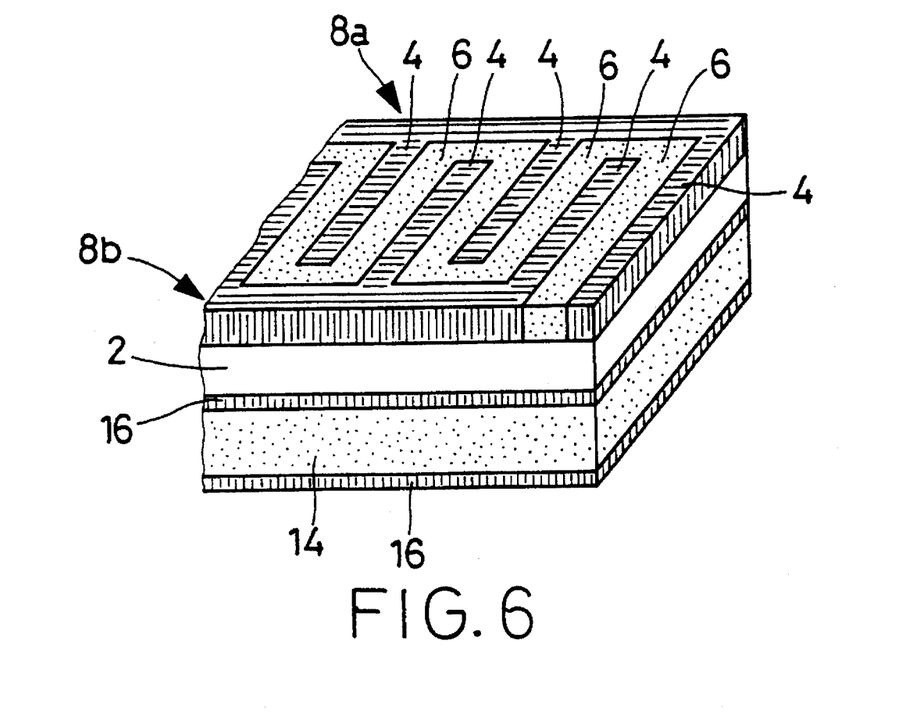
Figure 7:
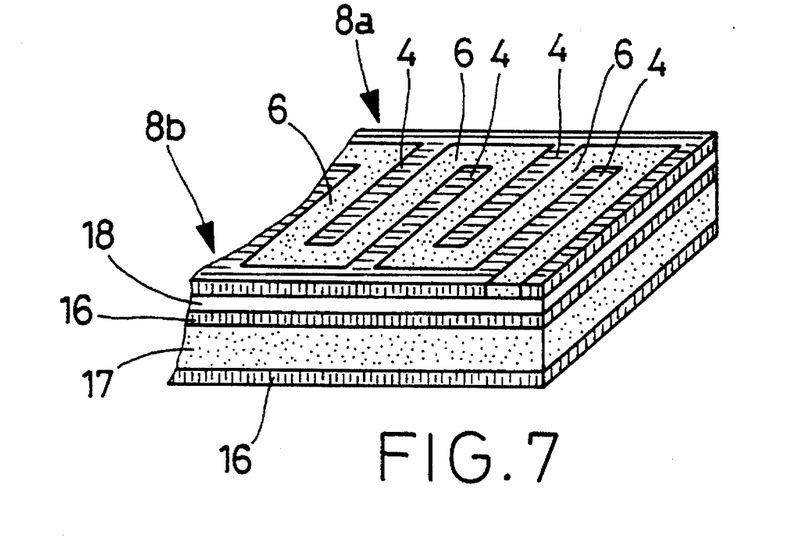

The piezoelectric/electrostrictive actuator of FIG. 6 consists of an actuator as shown in FIG. 3, and a three-layered laminar structure integrally formed on the major surface of the substrate 2 remote from the layer 6, 8a, 8b. The laminar structure consists of a first electrode layer 16 formed on the substrate 2, a piezoelectric/electrostrictive layer 14 formed on the first electrode layer 16, and a second electrode layer 16 formed on the piezoelectric/electrostrictive layer 14, whereby the layer 14 is sandwiched by and between the two electrode layers 16. The piezoelectric/electrostrictive layer 14 is formed of a piezoelectric or electrostrictive material similar to that used for the piezoelectric/electrostrictive elements 6. The substrate 2 of the actuator of FIG. 6 may be replaced by an electrically insulating layer 18, as shown in FIG. 7. In this case, the insulating layer 18 cooperates with the electrode layers 16 and piezoelectric/electrostrictive plate 17 to function as a substrate for the layer 6, 8a, 8b. In these actuators of FIGS. 6 and 7, a voltage is also applied between the two electrode layers 16, 16.

Figure 8:
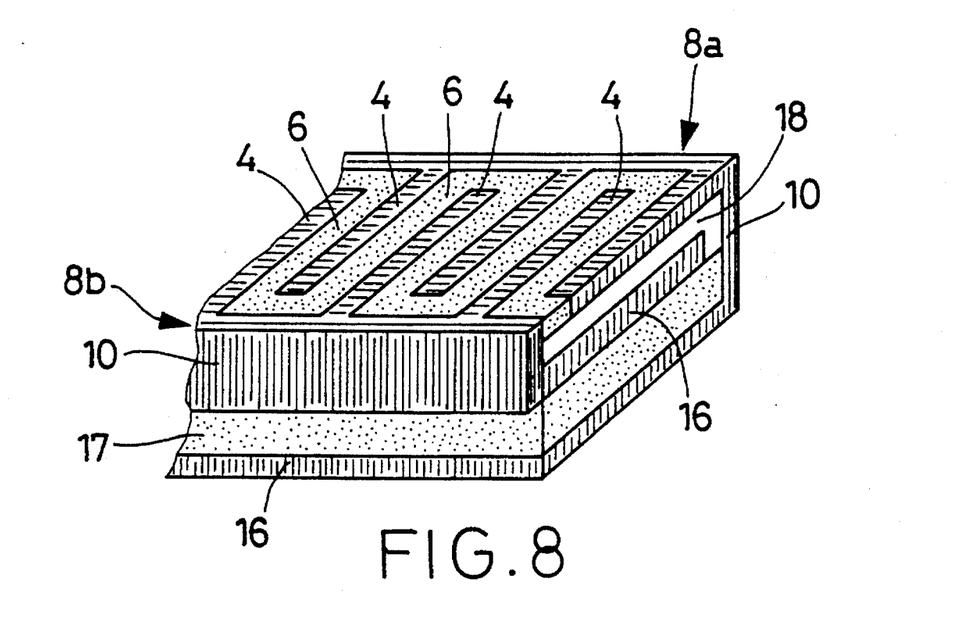

The piezoelectric/electrostrictive actuator of FIG. 8 is a modification of the embodiment of FIG. 7, in which the connecting portion 10 of the comb-like electrode pattern 8a extends to be connected to the outer or second electrode layer 16, while the connecting portion 10 of the other comb-like electrode pattern 8b extends to be connected to the inner or first electrode layer 16. In this arrangement, the application of a voltage to the comb-like electrode patterns 8a, 8b results in concurrent application of the voltage to the electrode layers 16, 16.

Figure 9:
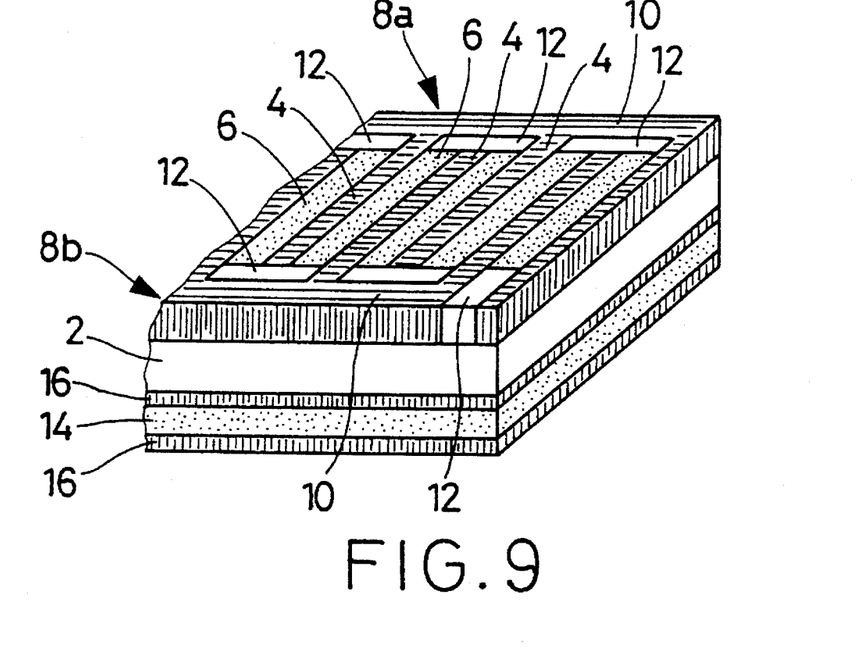

The piezoelectric/electrostrictive actuator of FIG. 9 consists of an actuator as shown in FIG. 4, and the three-layered laminar structure 14, 16, 16 which is integrally formed on the surface of the substrate 2 remote from the layer 6, 8a 8b, 12, such that the piezoelectric/electrostrictive layer 14 is sandwiched by and between the two electrode layers 16, 16. As in the embodiment of FIG. 4, the insulating portions 12 electrically insulate the electrodes 4 of the electrode pattern 8a from the connecting portion 10 of the other electrode pattern 8b, while insulating the electrodes 4 of the electrode pattern 8b from the connecting portion 10 of the electrode pattern 8a.

The piezoelectric/electrostrictive actuators of bimorph type shown in FIGS. 6 through 9 undergo a comparatively large amount of flexural displacement, due to the strains which occur in the piezoelectric/electrostrictive layer 14 due to the voltage applied between the two electrode layers 16, 16, in addition to the strains which generated in the piezoelectric/electrostrictive elements 6 due to the voltage applied to the electrode strips 4. In this respect, it is noted that the voltage is applied to the layers 14 (so that the layer 14 is contracted) and elements 6 (so that the layer 14 is elongated) so that the electric fields have the same polarity as that of the initial polarization given to the layers 14 and elements 6, while the actuator is bending or producing a force. Accordingly, the initial polarization of the piezoelectric/electrostrictive layers and elements 14, 6 is not deteriorated or lost, and their operating durability and reliability are effectively improved.

Figure 10:
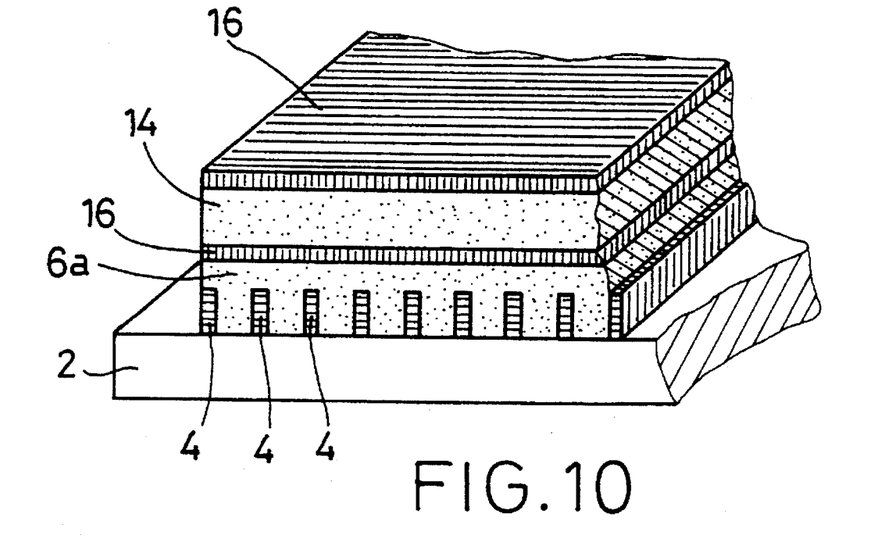

Referring next to FIG. 10, there is shown another modified embodiment of the present invention, in which the electrode strips 4 are formed on one major surface of the substrate 2 such that the strips 4 are equally spaced apart from each other by a suitable spacing distance. The array of the electrode strips 4 is embedded in a piezoelectric/electrostrictive layer 6a having a suitable thickness. The laminar structure consisting of the piezoelectric/electrostrictive layer 14 and the two electrode layers 16, 16 sandwiching the layer 14 is formed on the layer 6a.

While only one actuator is provided on one substrate in the illustrated embodiments of FIGS. 1–11, the principle of the present invention may be advantageously applied to an arrangement in which a single substrate carries a plurality or multiplicity of piezoelectric or electrostrictive actuators, each of which includes electrode strips and piezoelectric/electrostrictive elements or layer.

The substrate 2 used in the illustrated embodiments described above has a suitable shape or configuration, depending upon the application of the relevant actuator. For example, the substrate 2 has a polygonal shape such as triangle, square, pentagon or hexagon, or other shapes such as circle, ellipse or annulus, or any special shapes, which include a combination of the above shapes. The substrate 2 may have any desired cutouts or voids.

The substrate 2 may be formed of a single crystal, or a material selected from various ceramics, and may desirably have anisotropy in terms of elasticity. The ceramic material may be either an oxide or a non-oxide material. The substrate 2 may be provided by a metal sheet or an alloy sheet, the relevant surface portion or portions of which is/are at least partially covered by an insulating layer or layers.

Where the substrate 2 is formed of a ceramic material, the ceramic substrate may consist of a dielectric sheet, a piezoelectric sheet, or other ceramic sheet having a certain function, as well as an electrically insulating sheet. Further, the substrate 2 may be formed of an elastic or soft material such as an organic film, and may have either a straight surface or surfaces, or a curved surface or surfaces.

Although the substrate 2 may be formed in a desired shape or configuration by using a material suitably selected from various known materials, the substrate is preferably formed of a ceramic material, in particular, a ceramic composition whose major component consists essentially of aluminum oxide, magnesium oxide, zirconium oxide, aluminum nitride or silicon nitride. For the substrate to exhibit excellent properties with a relatively small thickness as indicated below, it is particularly desirable to use the ceramic composition including aluminum oxide or zirconium oxide as a major component.

The thickness of the ceramic substrate is preferably 100 μm or less, more preferably 50 μm or less, and most preferably 30 μm or less. The Young's modulus of the ceramic substrate is preferably between $1.5 \times 10^6$ kg/cm$^2$ and $4.5 \times 10^6$ kg/cm$^2$, and more preferably between $2.0 \times 10^6$ kg/cm$^2$ and $4.0 \times 10^6$ kg/cm$^2$. Further, the bending strength of the ceramic substrate is preferably 1200 kgf/cm$^2$ or higher, and more preferably 1500 kgf/cm$^2$ or higher. The applicants discovered that the use of the ceramic substrate having the thickness and properties within the above-specified ranges is desirable for permitting the piezoelectric/electrostrictive actuator of the present invention to provide sufficiently large amount or magnitude of flexural displacement and force, and a sufficiently high operating response.

The electrode strips 4 and electrode layer 16 may be formed of any known electrode material such as metals, alloys, intermetallic compounds or electrically conductive ceramics. In forming the electrodes, these materials are applied by a suitable technique such as thick-film or thin-film forming techniques, plating techniques or coating techniques. The applied electrode material in the form of a layer is patterned by a suitable known method such as laser cutting, slicing, or other machining operations, or photo-lithographic etching technique.

The piezoelectric/electrostrictive elements 6 or layer 14, 6a may be a known material which exhibits the reverse piezoelectric effect or the electrostrictive effect. Such a piezoelectric or electrostrictive material may either require a treatment for the initial polarization or poling, or may not require such a polarization treatment. The material may take the form of a crystal, a semiconductor, a ceramic or polymer weight material, or a composite material thereof.

The major component of the piezoelectric/electrostrictive composition used preferably consists of lead zirconium titanate (PZT), lead magnesium niobate (PMN), lead nickel niobate (PNN), lead manganese niobate, lead antimony stannate, lead titanate, barium titanate, lead niobate, barium niobate, or a mixture thereof. Further, a material (such as PLZT) containing lanthanum (La), barium (Ba), niobium (Nb), zinc (Zn), nickel (Ni) and/or manganese (Mn) may be added to the piezoelectric or electrostrictive composition whose major component consists of PZT. In view of the construction of the piezoelectric/electrostrictive actuator according to the present invention, it is desirable that the piezoelectric constant $|d_{33}|$ of the material used for the piezoelectric/electrostrictive elements or layer is $100 \times 10^{-12}$ [C/N] or higher, for assuring excellent operating characteristics of the actuator.

The selected piezoelectric/electrostrictive material is applied to the substrate 2 or electrode layer 16 to form the piezoelectric/electrostrictive elements 6 or layer 14, 6a, by a thin-film forming technique such as vacuum vapor deposition, sputtering, ion-plating, cluster-ion beam process or CVD, or a coating technique such as spinning, dipping, spraying or brushing, or alternatively by a thick-film forming technique such as a printing technique by using a printing paste without a bonding adhesive. However, the printing technique is most desired. For improved properties of the piezoelectric/electrostrictive material, heat-treating the formed thin or thick film is very effective.

While the presently preferred embodiments of the piezoelectric/electrostrictive actuator of this invention have been described in detail by reference to the drawings, it is to be understood that the invention is not limited to the details of the illustrated embodiments.

It is also to be understood that the present invention may be embodied with various changes, modifications and improvements, which may occur to those skilled in the art, without departing from the spirit and scope of the invention defined in the following claims.

What is claimed is:

1. A piezoelectric/electrostrictive actuator consisting essentially of:

a ceramic substrate having a major component consisting essentially of aluminum oxide, magnesium oxide, zirconium oxide, aluminum nitride, or silicon nitride, and having a thickness of not greater than 30 μm and a bending strength of at least 1500 kgf/cm$^2$;

a plurality of electrodes comprising a metal, an alloy, an intermetallic compound, or an electrically conductive ceramic in the form of strips integrally formed, without use of a bonding adhesive, on at least a portion of at least one surface of the substrate by one of a thick-film forming technique and a thin-film forming technique, such that said strips are spaced from each other in a direction parallel to said at least one surface; and a piezoelectric/electrostrictive portion comprising a piezoelectric/electrostrictive ceramic material which is integrally formed without use of a bonding adhesive, by a thick-film forming technique, between the adjacent strips of the electrodes in said direction, and in contact with said adjacent strips, said piezoelectric/electrostrictive portion producing a flexural displacement or force due to at least a longitudinal mode of converse piezoelectric effect or electrostrictive effect upon application of a voltage between said adjacent strips of the electrodes, said piezoelectric/electrostrictive ceramic material having a major component which consists essentially of at least one material selected from the group consisting of: lead zirconium titanate, lead magnesium niobate, lead nickel niobate, lead manganese niobate, lead antimony stannate, lead titanate, barium titanate, lead niobate, barium niobate and a mixture thereof.

2. A piezoelectric/electrostrictive actuator according to claim 1, wherein said strips of said plurality of electrodes consist of parallel elongate parts of two comb-like electrode patterns which are patterned and positioned relative to each other such that said elongate parts of one of said two electrode patterns and said elongate parts of the other electrode pattern are disposed alternately in said direction, each one of said two comb-like electrode patterns including a connecting portion which is formed integrally with said elongate parts and connects said elongate parts at one of opposite ends thereof such that said elongate parts of said each one electrode pattern extend from said connecting portion thereof toward the connecting portion of the other electrode pattern.

3. A piezoelectric/electrostrictive actuator according to claim 1, wherein said strips of the electrodes and said piezoelectric/electrostrictive portion are formed on one of opposite major surfaces of said substrate, said actuator further comprising a laminar structure consisting of a first electrode layer formed on the other of said opposite major surfaces of the substrate, a piezoelectric/electrostrictive layer formed on said first electrode layer, and a second electrode layer formed on said piezoelectric/electrostrictive layer.

4. A piezoelectric/electrostrictive actuator according to claim 1, wherein said substrate comprises a piezoelectric/electrostrictive plate formed of a piezoelectric/electrostrictive material, and two electrode layers sandwiching said piezoelectric/electrostrictive plate.

5. A piezoelectric/electrostrictive actuator according to claim 1, wherein said plurality of electrodes are embedded in said piezoelectric/electrostrictive portion.

6. A piezoelectric/electrostrictive actuator consisting essentially of:

a ceramic substrate having a major component consisting essentially of aluminum oxide, magnesium oxide, zirconium oxide, aluminum nitride, or silicon nitride, and having a thickness of not greater than 30 μm and a bending strength of at least 1500 kgf/cm$^2$;

a plurality of electrodes comprising a metal, an alloy, an intermetallic compound, or an electrically conductive ceramic in the form of strips integrally formed, without use of a bonding adhesive, on at least a portion of at least one surface of the substrate by one of a thick-film forming technique and a thin-film forming technique, such that said strips are spaced from each other in a direction parallel to said at least one surface; and a piezoelectric/electrostrictive portion comprising a piezoelectric/electrostrictive ceramic material which is integrally formed without use of a bonding adhesive, by a thick-film forming technique, between the adjacent strips of the electrodes in said direction, and in contact with said adjacent strips, said piezoelectric/electrostrictive portion producing a flexural displacement or force due to at least a longitudinal mode of converse piezoelectric effect or electrostrictive effect upon application of a voltage between said adjacent strips of the electrodes, said piezoelectric/electrostrictive ceramic material having a major component which consists essentially of at least one material selected from the group consisting of: lead zirconium titanate, lead magnesium niobate, lead nickel niobate, lead manganese niobate, lead antimony stannate, lead titanate, barium titanate, lead niobate, barium niobate and a mixture thereof.

\* \* \* \* \*